United States Patent [19]

Nakano et al.

[11] Patent Number: 4,755,551

[45] Date of Patent: Jul. 5, 1988

[54] ELECTRODEPOSITION RESINOUS PAINT COMPOSITION

[75] Inventors: Tsunetomo Nakano; Fumio Sakatani; Mitsushi Taguchi, all of Ichihara, Japan

[73] Assignee: UBE Industries, Ltd., Ube, Japan

[21] Appl. No.: 70,566

[22] Filed: Jul. 7, 1987

[30] Foreign Application Priority Data

Jul. 11, 1986 [JP] Japan .................... 61-164519

[51] Int. Cl.$^4$ .............................................. C08K 3/22
[52] U.S. Cl. ...................................... 524/430; 524/437; 524/445; 524/495; 524/497; 524/539; 524/901; 525/443; 525/446; 427/97; 428/901
[58] Field of Search ............... 525/443, 446; 524/430, 524/437, 445, 901; 427/97; 428/901

[56] References Cited

U.S. PATENT DOCUMENTS 3,935,147 1/1976 Godshalk ...................... 525/466

Primary Examiner—Theodore E. Pertilla
Attorney, Agent, or Firm—Frishauf, Holtz Goodman & Woodward

[57] ABSTRACT

An electrodeposition resinous paint composition comprising (a) a modified alkyd resin, (b) a melamine resin, (c) a water-soluble silicone resin and (d) an inorganic filler, in which these components (a), (b), (c) and (d) are contained in the following ratios by weight:

$[(a)/[(a)+(b)]] = 0.4-0.9;$ $[(c)/[(a)+(b)]] = 0.01-0.1;$ and $[(d)/[(a)+(b)+(c)]] = 0.1-1.0.$ 6 Claims, 2 Drawing Sheets

ELECTRODEPOSITION RESINOUS PAINT COMPOSITION

BACKGROUND OF THE INVENTION

1. Field of the Invention

The present invention relates to an electrodeposition resinous paint composition suitably employable as a resist for the formation of a through-hole and a circuit pattern in a circuit-printed board having a through-hole.

2. Description of Prior Art

As electrodeposition resinous paints (i.e., resinous paints for electrical deposition), there are known an anionic paint and a cationic paint. The anionic paint can be obtained by neutralizing a maleic oil synthesized from a natural drying oil and maleic anhydride, a phenol modified maleic oil obtained by modifying said maleic oil with a phenol resin, a resin such as a copolymer of an acrylic acid or its ester, or a modified alkyd resin prepared by esterifying a polybasic acid and a polyhydric alcohol, with an amine, a potassium hydorxide or the like to make it water-soluble or water-dispersible. The cationic paint can be prepared by reacting an epoxy resin with a secondary amine to cleave at least a portion of epoxy groups in the epoxy resin and neutralizing the resulting resin to make it water-soluble or water-dispersible.

The present inventors have already developed a process for the preparation of a circuit-printed board having a through-hole using an electrodeposition resinous paint as a resist for forming a through-hole and a circuit pattern.

The steps of the process can be schematically described by referring to FIG. 1 of the attached drawings.

In the first step, a board 1 (substrate) laminated with a copper foil on both surfaces and having a through-hole 2 is plated to form a plated layer 3 on the substrate, as shown in (1) of FIG. 1. In the second step, a resist layer 4 having a reverse pattern for a desired circuit pattern is formed on the surface of the plated layer 3 on the substrate 1, as shown in (2) of FIG. 1. Subsequently, on the exposed area of the plated layer 3 was deposited a resinous paint layer 5 by electrical deposition, as shown in (3) of FIG. 1. Thereafter, only the resist layer is removed as shown in (4) of FIG. 1, and then the exposed portion of the plated layer and the copper foil placed thereunder are removed by etching as shown in (5) of FIG. 1. Finally, the deposited resinous layer 5 is removed as shown in (6) of FIG. 1, to prepare a circuit-printed board having a through-hole.

The above-described process can be employable to efficiently prepare a circuit-printed board having a through-hole with high productivity. However, this process has various drawbacks in the case of using the aforementioned conventional resinous paints as a material of the deposited resinous paint layer.

For example, the conventional resinous paints except the paint of modified alkyd resin should be subjected to a heat treatment at a high temperature in the range of 180° to 200° C. to obtain high resistance required for the etching stage. Under the conditions of such heat treatment, curing of the resist layer having the reverse pattern is accelerated, whereby it is made difficult to remove only the resist layer and further it is also difficult to remove the deposited resinous paint layer at a later step.

A resinous paint of the modified alkyd resin can be cured by a heat treatment at a low temperature such as approx. 130° C. and has a resistance to etching. However, in the case of forming a pattern of extremely small size such as a pattern of approx. 100 μm wide, the deposited resinous paint layer tends to be removed with the resist layer in the stage of removing the resist layer.

It is desired that a resinous paint layer having uniform thickness is formed on the wall of the through-hole in the manner as shown in FIG. 2. However, if the conventional resinous paint is electrically deposited over the wall of the through-hole, the deposited layer is easily softened to flow down from the edge portion of the through-hole because of surface tension, etc. in the heat subsequent treatment procedure, as shown in FIG. 3, whereby the plated layer is apt to be etched out at the edge portion of the through-hole by an etching solution in the etching stage.

Further, the deposited layer of the aforementioned conventional resinous paint generally has a low surface hardness, and hence the layer is liable to be damaged in contact with a roll, etc. in the conveying procedure applied to the board.

SUMMARY OF THE INVENTION

It is an object of the present invention to provide an electrodeposition resinous paint composition being capable of forming a deposited resinous paint layer which is not peeled off when a resist layer having a reverse pattern is removed, but is easily removed in the final removing stage after etching.

It is another object of the invention to provide an electrodeposition resinous paint composition which can be evenly deposited to form a deposited resinous paint layer having uniform thickness.

It is a further object of the invention to provide an electrodeposition resinous paint composition being capable of forming a deposited resinous paint layer which is hardly damaged even when it is brought into contact with a roll in the boad conveying procedure.

The present inventors have discovered that the above objects can be accomplished by a resinous paint composition containing a modified alkyd resin, a melamine resin, a water-soluble silicone resin and an inorganic filler in amounts of specific ratios.

There is provided by the present invention an electrodeposition resinous paint composition comprising a modified alkyd resin (a), a melamine resin (b), a water-soluble silicone resin (c) and an inorganic filler (d), in which:

a weight ratio of the amount of the modified alkyd resin to the total amount of the modified alkyd resin and the melamine resin, [(a)/[(a)+(b)]], is in the range of 0.4 to 0.9;

a weight ratio of the amount of the water-soluble silicone resin to the total amount of the modified alkyd resin and the melamine resin, [(c)/[(a)+(b)]], is in the range of 0.01 to 0.1; and a weight ratio of the amount of the inorganic filler to the total amount of the modified alkyd resin, the melamine resin and the water-soluble silicone resin, [(d)/[(a)+(b)+(c)]], is in the range of 0.1 to 1.0.

DETAILED DESCRIPTION OF THE INVENTION

Figure 1:
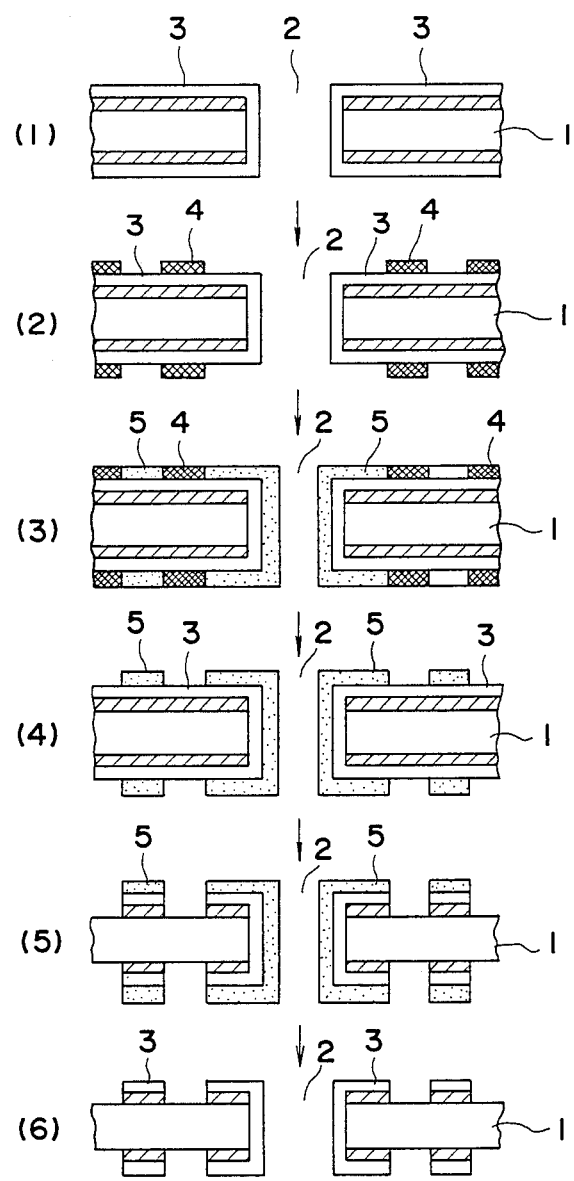
FIG. 1 is an enlarged sectional view schematically showing the steps of a process for the preparation of a circuit-printed board having a through-hole which employs the resinous paint composition of the invention.
Figure 2:
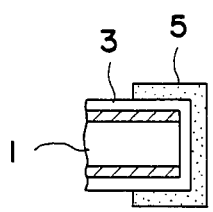
FIG. 2 is an enlarged sectional view showing the condition that the resinous paint composition of the invention is electrically deposited to form a satisfactorily deposited resinous paint layer on the through-hole portion.

The alkyd resin (a) in the components constituting the resinous paint composition of the present invention is selected from those conventionally employed. The alkyd resin can be obtained by reacting a mixture of an acid component and polyhydric alcohol with a modifying material. The alkyd resin employed in the invention preferably has an average molecular weight of 500 to 2,000.

Examples of the acid component employable for the preparation of the modified alkyd resin include saturated polybasic acids such as phthalic acid and trimellitic acid, anhydrides thereof, unsaturated polybasic acids such as maleic acid, maleic anhydride, fumaric acid, itaconic acid and citraconic anhydride, and polybasic acids obtained by diene synthesis such as an adduct of cyclopentadiene and maleic anhydride, an adduct of rosin and maleic anhydride and an adduct of terpene and maleic anhydride.

Examples of polyhydric alcohol employable for the preparation of the modified alkyd resin include dihydric alcohols such as diethylene glycol, trihydric alcohol such as glycerol, and tetrahydric alcohol such as pentaerythritol.

Examples of the modifying materials employable for the preparation of the modified alkyd resin include natural oils such as soybean oil and castor oil, fatty acids obtained therefrom, fatty acids such as stearic acid and oleic acid, and natural resins such as rosin, copal and amber.

As the melamine resin (b), a water-soluble melamine resin which is prepared from 1 mol of melamine, 5-6 moles of formaldehyde and excessive methanol and butanol is preferably employed.

As the water-soluble silicone resin (c), there can be mentioned a resin obtained by substituting a methyl group of three-dimensionally crosslinked dimethylpolysiloxane with an alkyl group, a phenyl group, etc. and a silicone resin which is commercially available as alkyd resin paint additives.

As the inorganic filler (d), there can be mentioned carbon black, titanium dioxide, silicon oxide, aluminum oxide and clay. They can be employed singly or in combination. The inorganic filler having a particle size of approx. 10 to 75 μm is preferably employed in the invention.

The modified alkyd resin (a), melamine resin (b), water-soluble silicone resin (c) and inorganic filler (d) are employed in the specific ratios in the present invention. In more detail, a weight ratio of the amount of the modified alkyd resin to the total amount of the modified alkyd resin and the melamine resin, $[(a)/[(a)+(b)]]$, is in the range of 0.4 to 0.9, preferably 0.5 to 0.9; a weight ratio of the amount of the silicone resin to the total amount of the modified alkyd resin and the melamine resin, $[(c)/[(a)+(b)]]$, is in the range of 0.01 to 0.1, preferably 0.02 to 0.06; and a weight ratio of the amount of inorganic filler to the total amount of the modified alkyd resin, melamine resin and the water-soluble silicone resin, $[(d)/[(a)+(b)+(c)]]$, is in the range of 0.1 to 1.0, preferably 0.1 to 0.6.

The resinous paint composition of the present invention can be prepared, for example, in the following way.

In the first place, the modified alkyd resin and the melamine resin are mixed in the amounts specified as above to prepare a resinous mixture. To the resinous mixture is added an alcohol such as ethanol or isopropyl alcohol to give a resinous solution having a nonvolatile content of 60 to 90% by weight. To the resinous solution is then added the water-soluble silicone resin in the amount defined as above and further added the inorganic filler in the amount also defined as above, to prepare a resinous paint composition of the invention.

When the value of $[(a)/[(a)+(b)]]$ is more than 0.9, that is, when the modified alkyd resin is employed excessively, a long period of time is required for curing the resulting paint (composition), or the resulting paint has surface tack so as not to be cured sufficiently. When the value of $[(a)/[(a)+(b)]]$ is less than 0.4, that is, when the amount of the modified alkyd resin is too small, bonding between the deposited resinous paint layer and the surface of the copper plated layer becomes poor, whereby the deposited resinous paint layer is liable to peel off in the stage of removing a photoresist layer by washing with water.

When the value of $[(c)/[(a)+(b)]]$ is more than 0.1, that is, when the water-soluble silicone resin is used excessively, the resulting resinous paint is made poor in dispersibility, whereby the deposited paint layer likely decreases in strength. When the value of $[(c)/[(a)+(b)]]$ is less than 0.01, that is, when the amount of the water-soluble silicone resin is too small, the deposited resinous paint layer of the resulting composition is made poor in resistance to abrasion, whereby the deposited paint layer is easily damaged in contact with rolls, etc.

When the value of $[(d)/[(a)+(b)+(c)]]$ is more than 1.0, that is, when the inorganic filler is employed excessively, the deposited resinous paint layer of the resulting composition (paint) has a rough surface of so-called "orange peel face", and a great number of pin holes are produced on the surface. When the value of $[(d)/[(a)+(b)+(c)]]$ is less than 0.1, that is, when the amount of the inorganic filler is too small, a protective layer having a satisfactory thickness cannot be formed on the edge portion of the through-hole, as illustrated in Comparison Example 3 and shown in FIG. 3.

The electrodeposition resinous paint composition of the invention may contain other additives such as pigments (e.g., phthalocyanine green, phthalocyanine blue Hansa Yellow and barium sulfate) and surface active agents for dispersing the pigments (e.g., nonionic surface active agent).

The resinous paint composition of the invention is generally used in the form of an aqueous dispersion in the step of the electrical deposition. The dispersion generally has a nonvolatile content of 5 to 20% by weight, preferably 10 to 18% by weight. Further, an amine such as ammonia or triethylamine is preferably added to the dispersion under the condition that the resulting dispersion shows a pH in the range of 7.5-8.5 at a nonvolatile content of 15% by weight. The amine may be beforehand incorporated into the resinous paint composition of the invention prior to dispersing in water so that the resulting dispersion would have the above-defined pH.

The dispersion containing the resinous paint composition of the invention prepared as above is electrically deposited to form a resinous paint layer by the following process.

In the first place, electrical deposition is done using the above dispersion to deposit the resinous paint composition over a surface of a sheet or a board, so as to form a layer of the resinous paint composition of the invention.

The electrical deposition can be done in any known manner. Preferred conditions include a voltage applied for the deposition in the range of 5 to 100 V.

In the second place, the layer of the resinous paint composition is heated at a temperature of approx. 130° to 150° C. for 5 to 30 min., to cure the deposited layer. Thus, an electrically deposited resinous paint layer of the resinous paint composition of the invention can be prepared.

The electrically deposited resinous paint layer of the resinous paint composition of the invention prepared as above is highly resistant to a copper etching solution such as a ferric chloride solution, and can be easily removed by a removing solution such as a mixture solvent of sodium hydroxide and diethylene glycol.

As described hereinbefore, the resinous paint composition of the present invention can be employed to form a deposited resinous paint layer which does not peel off in the stage of removing a resist layer having a reverse pattern but easily removed in the final removal stage after etching. Further, the composition can be evenly deposited to form a deposited resinous paint layer having uniform thickness. Furthermore, the composition is employable for forming a deposited resinous paint layer which is hardly damaged even when the layer is placed in contact with a roller in the conveying procedure of the board. Accordingly, the composition of the invention is suitably employed as a resist for the formation of a through-hole and a circuit pattern in a circuit-printed board having a through-hole.

In more detail, the electrodeposition resinous paint composition of the present invention has the following advantages:

(1) Both of the modified alkyd resin and the melamine resin are electrically deposited through the reaction thereof, and the melamine resin accelerates to cure the modified alkyd resin by the heat treatment, whereby a deposited resinous paint layer having high strength can be formed by heating at a low temperature of 130° to 150° C. Accordingly, the resist layer having a reverse pattern is not excessively cured, and hence only the resist layer can be removed. Further, the deposited resinous paint layer does not peel off when the resist layer having a reverse pattern is removed but is easily removed in the final removal stage after etching.

(2) Since the inorganic filler is electrically deposited with the resin components, it does not occur that an apparent viscosity of the resulting deposited resinous paint layer increases (that is, the layer is dried apparently) and that the deposited resinous paint layer is softened to flow down from the edge portion of the through-hole in the heat treatment, whereby a deposited resinous paint layer having uniform thickness can be formed. Accordingly, the copper plated layer is not etched out at the edge portion of the through-hole by the etching solution in the etching step.

(3) Since the water-soluble silicone resin is electrically deposited with other components, a friction coefficient on the surface of the deposited resinous paint layer decreases, whereby resistance to abrasion is well enhanced. Accordingly, the deposited resinous paint layer is not damaged even when it is placed in contact with a roller in the conveying procedure of the board.

The present invention is further illustrated by the following examples.

REFERENCE EXAMPLE 1

PREPARATION OF MODIFIED ALKYD RESIN

A mixture of 620 g. of soybean oil fatty acid (acid value: 155), 500 g. of rosin (acid value: 170), 600 g. of tall oil-fatty acid (acid value: 192), 140 g. of linoleic acid, 140 g. of linolenic acid and 300 g. of maleic anhydride was subjected to reaction at 200° C. for 3 hours in a nitrogen atmosphere. The reaction liquid is then cooled to 100° C., and to the cooled reaction liquid is added 150 ml of xylene, 1,000 g. of pentaerythritol and 900 g. of trimellitic anhydride. The mixture was again heated to 150° C., and the reaction was terminated when the acid value of the mixture was 100. Then, the mixture was cooled. During the reaction, xylene was removed under reduced pressure. When the reaction liquid was cooled to 70° C., 500 g. of isopropyl alcohol and 500 g. of triethylamine were dissolved in the liquid, to prepare a modified alkyd resin solution having a solid content of approx. 83% by weight.

REFERENCE EXAMPLE 2

PREPARATION OF ACRYLIC ACID RESIN FOR ANIONIC RESINOUS PAINT

A mixture of 60 g. of butyl acrylate, 25 g. of styrene, 15 g. of methacrylic acid, 1 g. of t-butyl perbenzoate, 1 g. of benzoyl peroxide and 34.7 g. of ethylene glycol mono-n-butyl ether was subjected to reaction at 130° C. for 5 hours in a nitrogen atmosphere. The reaction liquid was then cooled, and to the cooled reaction liquid was added 20 g. of triethylamine, to prepare an acrylic acid resin solution having a solid content of approx. 70% by weight.

EXAMPLE 1

To 120 g. of the modified alkyd resin solution obtained in Reference Example 1 was added 140 g. of a water-soluble melamine resin (trade name: Nikalac MX-706, solid content: 70 wt. %, available from Sanwa Chemical Co., Ltd.), and they were well mixed to give a mixture. To the mixture was successively added 3 g. of a water-soluble silicone resin (SH29PA, available from Toray Silicone Co., Ltd.), 50 g. of titanium dioxide (mean particle size: approx. 50 μm) and 50 g. of clay (mean particle size: approx. 50 μm), and they were well mixed to prepare a resinous paint composition of the invention.

Using the resinous paint composition prepared as above, a circuit-printed board having a through-hole was prepared by the following process according to the steps of a process for the preparation of a circuit-printed board having a through-hole as shown in FIG. 1.

To the resinous paint composition of the invention prepared as above was added water to give an aqueous dispersion having a nonvolatile content of 15% by weight. To the dispersion was then added triethylamine in such an amount that the dispersion would have pH of 8.2, to prepare an anionic resinous paint (amino-alkyd resin type).

Separately, an epoxy treated glass plate 1 (substrate) laminated with copper foil on both surfaces was processed to have a through-hole 2 (diameter: 500 μm) on a predetermined position, and the wall of the through-hole 2 and whole surface of the copper foil on the laminated substrate 1 were plated with copper to form a copper plated layer 3, as shown in (1) of FIG. 1. An etching resist ink (Etching Resist SER-42OC, available from Sanei Chemical Co., Ltd.) was coated over the copper plated layer except on the wall of the plated through-hole by printing to give a resist coated layer 4 (i.e., resist layer) having a reverse pattern for a desired circuit pattern, as shown in (2) of FIG. 1.

Subsequently, the substrate was immersed in the anionic resinous paint prepared as above to perform electrical deposition. The electrical deposition was carried out by placing a stainless plate (cathode) and the processed substrate having the exposed portion (anode) of the copper plated layer in the paint and applying a voltage of 100 V for 1 minute between the cathode and the anode to form a layer of the resinous paint composition (paint) of the invention on the exposed portion of the copper plated layer. The substrate having the layer of the resinous paint composition was washed with running water for 1 minute to remove the undeposited and unfixed paint, and water attached to the substrate was dropped out. The substrate was then heated to 130° C. for 10 min. in a hot air oven to cure the layer of the resinous paint. Thus, a deposited resinous paint layer 5 of the resinous paint composition of the invention was formed, as shown in (3) of FIG. 1.

After cooling, the substrate provided with the resist layer and the deposited resinous paint layer on the copper plated layer was immersed in 4% aqueous sodium hydroxide solution at 40° C. for 2 min. to remove only the resist layer 4 from the substrate, as shown in (4) of FIG. 1.

After the substrate was subjected to a procedure for washing with water and water-removal, the substrate was immersed in an aqueous ferric chloride solution (40 Bé) at 50° C. for 10 min. to remove the copper foil and the copper plated layer provided thereon, both of which were unnecessary for the circuit, by etching, as shown in (5) of FIG. 1.

The substrate having been processed by the etching was washed with water, and then immersed in a removing solution comprising 90 parts by weight of 4% aqueous sodium hydroxide solution and 10 parts by weight of diethylene glycol at 50° C. for 5 min. to remove the deposited resinous paint layer 5.

Thus, a board having a printed circuit on both surfaces in which both circuits were electrically connected via the copper foil and the copper plated layer in the through-hole was prepared.

In the above process, the substrate having been processed by removing the resist layer therfrom as shown in (4) of FIG. 1 was examined on deterioration of the pattern by rolling a roller of polyvinyl chloride (diameter: 70 mm, PVC roller) on its surface. It was confirmed that no damage was given to the pattern. It was further confirmed that the copper plated layer on the edge portion of the through-hole was not etched out by the etching solution, and hence any break of the circuit was not observed in the obtained circuit-printed board having a through-hole.

COMPARISON EXAMPLE 1

The acrylic acid resin solution prepared in Reference Example 2 was added with water to give a dispersion having a nonvolatile content of 15% by weight. To the dispersion was added triethylamine in such an amount that the dispersion would have pH of 8.2, to prepare an anionic resinous paint (acrylic type paint).

The procedure of Example 1 was repeated except for using the above-prepared anionic resinous paint to try to prepare a circuit-printed board having a through-hole. However, in the step of removing the resist layer, the deposited resinous paint layer was removed together with the resist layer, so that it was impossible to prepare a circuit-printed board having a through-hole.

COMPARISON EXAMPLE 2

The procedure of Example 1 was repeated except for using the anionic resinous paint prepared in Comparison Example 1 and setting the heating and curing conditions of the deposited resinous paint layer to 170° C. and 20 min., to try to prepare a circuit-printed board having a through-hole. However, any of the resist layer and the deposited resinous paint layer was not removed from the substrate so that it was impossible to prepare a circuit-printed board having a through-hole.

COMPARISON EXAMPLE 3

The procedure of Example 1 was repeated except for not using the inorganic filler to prepare an anionic resinous paint.

Figure 3:
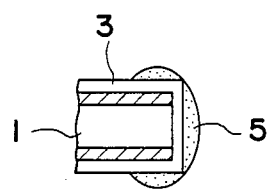
FIG. 3 is an enlarged sectional view showing the unfavorable condition of the deposited resinous paint layer such as formed in the case of Comparison Example 3.

Using the anionic resinous paint, a circuit-printed board having a through-hole was prepared in the same manner as described in Example 1. In this process, a deposited resinous paint layer showing such a condition as shown in FIG. 3 was formed, and hence the copper plated layer was etched out on the edge portion of the through-hole in the etching stage. As a result, the circuit was broken in the obtained circuit-printed board having a through-hole.

COMPARISON EXAMPLE 4

The procedure of Example 1 was repeated except for not using the water-soluble silicone resin to prepare an anionic resinous paint.

Using the anionic resinous paint, a circuit-printed board having a through-hole was prepared in the same manner as described in Example 1. In this process, the substrate having been processed by removing the resist layer therefrom as shown in (4) of FIG. 1 was examined on deterioration of the pattern by rolling a PVC roller on its surface. It was confirmed that the pattern was damaged by contacting the roller, and hence the circuit was partially broken in the obtained circuit-printed board having a through-hole.

COMPARISON EXAMPLE 5

The procedure of Example 1 was repeated except for not using the melamine resin to prepare an anionic resinous paint.

Using the anionic resinous paint, a circuit-printed board having a through-hole was tried to be prepared in the same manner as described in Example 1. However, in the stage of removing the resist layer, the deposited resinous paint layer was removed together with the resist layer, so that it was impossible to prepare a circuit-printed board having a through-hole.

COMPARISON EXAMPLE 6

The procedure of Example 1 was repeated except for using the anionic resinous paint prepared in Comparison Example 5 and setting the heating and curing conditions of the deposited resinous paint layer to 170° C. and 20 min., to try to prepare a circuit-printed board having a through-hole. However, any of the resist layer and the deposited resinous paint layer was not removed from the substrate, so that it was impossible to prepare a circuit-printed board having a through-hole.

We claim:

1. An electrodeposition resinous paint composition comprising a modified alkyd resin, a melamine resin, a water-soluble silicone resin and an inorganic filler, in which:
   a weight ratio of the amount of the modified alkyd resin to the total amount of the modified alkyd resin and the melamine resin is in the range of 0.4 to 0.9;
   a weight ratio of the amount of the water-soluble silicone resin to the total amount of the modified alkyd resin and the melamine resin is in the range of 0.01 to 0.1; and
   a weight ratio of the amount of the inorganic filler to the total amount of the modified alkyd resin, the melamine resin and the water-soluble silicone resin is in the range of 0.1 to 1.0.

2. The paint composition as claimed in claim 1, wherein the weight ratio of the amount of the modified alkyd resin to the total amount of the modified alkyd resin and the melamine resin is in the range of 0.5 to 0.9.

3. The paint composition as claimed in claim 1, wherein the weight ratio of the amount of the water-soluble silicone resin to the total amount of the modified alkyd resin and the melamine resin is in the range of 0.02 to 0.06.

4. The paint composition as claimed in claim 1, wherein the weight ratio of the amount of the inorganic filler to the total amount of the modified alkyd resin, the melamine resin and the water-soluble silicone resin is in the range of 0.1 to 0.6.

5. The paint composition as claimed in claim 1, wherein the water-soluble silicone resin is resin obtained by substituting a methyl group of three-dimensionally crosslinked dimethylpolysiloxane with an alkyl group or a phenyl group.

6. The paint composition as claimed in claim 1, wherein the inorganic filler is selected from the group consisting of carbon black, titanium dioxide, silicon oxide, aluminum oxide and clay.

* * * * *